United States Patent
Reznicek et al.

(10) Patent No.: US 10,937,789 B2
(45) Date of Patent: Mar. 2, 2021

(54) NANOSHEET EDRAM

(71) Applicant: International Business Machines Corporation, Armonk, NY (US)

(72) Inventors: Alexander Reznicek, Troy, NY (US); Muthumanickam Sankarapandian, Niskayuna, NY (US); Donald F. Canaperi, Bridgewater, CT (US); Keith E. Fogel, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 16/002,852

(22) Filed: Jun. 7, 2018

(65) Prior Publication Data

US 2019/0378842 A1 Dec. 12, 2019

(51) Int. Cl.
*H01L 27/108* (2006.01)
*H01L 27/12* (2006.01)
(Continued)

(52) U.S. Cl.
CPC ...... *H01L 27/1087* (2013.01); *H01L 27/1203* (2013.01); *H01L 29/04* (2013.01); *H01L 29/0665* (2013.01); *H01L 29/43* (2013.01); *B82Y 10/00* (2013.01); *H01L 21/02532* (2013.01)

(58) Field of Classification Search
CPC ......... H01L 29/66439; H01L 29/78696; H01L 29/42392; H01L 29/66553; H01L 27/108–10897; H01L 29/0665; H01L 27/1087; H01L 27/1203; H01L 29/43; H01L 29/04; H01L 21/02532; H01L 27/10832; H01L 27/10879; H01L 27/10826; H01L 27/10829; H01L 27/1082; H01L 27/10805; H01L 27/10858; H01L 27/10867; H01L 27/10855; H01L 27/10847; H01L 27/10861; H01L 29/0669–068; H01L 29/7853; H01L 2029/7858; H01L 29/78687; H01L 29/42384–42392; B82Y 10/00
See application file for complete search history.

(56) References Cited

U.S. PATENT DOCUMENTS 6,570,208 B2  5/2003  Mandelman et al.
8,188,528 B2  5/2012  Pei et al.
(Continued)

OTHER PUBLICATIONS

Anonymous, "Trench DRAM with FinFET/nanowire access transistor and method of formation", ip.com, IPCOM000231566D, Oct. 7, 2013, 5 pages.

*Primary Examiner* — Nelson Garces
(74) *Attorney, Agent, or Firm* — Scully, Scott, Murphy & Presser, P.C.; L. Jeffrey Kelly, Esq.

(57) ABSTRACT

A semiconductor structure is provided in which a nanosheet device is formed laterally adjacent, but in proximity to, an embedded dynamic random access memory (eDRAM) cell. The eDRAM cell and the nanosheet device are connected by a doped polycrystalline semiconductor material that is formed during the epitaxial growth of doped single crystalline semiconductor source/drain regions of the nanosheet device. An eDRAM cut mask is used to remove unwanted semiconductor material from regions not including the eDRAM cell and the nanosheet device.

10 Claims, 22 Drawing Sheets

(51) Int. Cl.
*H01L 29/43* (2006.01)
*H01L 29/04* (2006.01)
*H01L 29/06* (2006.01)
B82Y 10/00 (2011.01)
H01L 21/02 (2006.01)

(56) References Cited

U.S. PATENT DOCUMENTS

| | | |
|---|---|---|
| 8,946,802 B2 | 2/2015 | Basker et al. |
| 9,006,810 B2 | 4/2015 | Chang et al. |
| 9,263,453 B1 | 2/2016 | Cheng et al. |
| 9,368,502 B2 | 6/2016 | Chang et al. |
| 9,627,478 B1 | 4/2017 | Leobandung |
| 9,646,972 B2 | 5/2017 | Baskaran et al. |
| 2009/0184392 A1* | 7/2009 | Cheng ............... H01L 21/26586 257/532 |
| 2013/0328161 A1* | 12/2013 | Cheng ............... H01L 27/10829 257/508 |
| 2013/0330891 A1* | 12/2013 | Chang .................... B82Y 10/00 438/241 |
| 2015/0221715 A1* | 8/2015 | Cheng ................. H01L 27/1203 257/301 |
| 2017/0278927 A1 | 9/2017 | Li et al. |
| 2017/0345945 A1* | 11/2017 | Lee ................... H01L 29/42392 |

\* cited by examiner

NANOSHEET EDRAM

BACKGROUND

The present application relates to a semiconductor structure and a method of forming the same. More particularly, the present application relates to a semiconductor structure including an embedded dynamic random access memory (eDRAM) cell integrated with a nanosheet device which avoids eDRAM to eDRAM shorts.

The use of non-planar semiconductor devices is the next step in the evolution of complementary metal oxide semiconductor (CMOS) devices. One type of non-planar semiconductor device that has been touted as a viable option for 5 nm technology node and beyond is a nanosheet containing device.

An embedded dynamic random access memory (eDRAM) cell is an important performance element for high performance server chips. There is a need to integrate an eDRAM cell into a nanosheet device which avoids eDRAM to eDRAM shorts.

SUMMARY

A semiconductor structure is provided in which a nanosheet device is formed laterally adjacent, but in proximity to, an embedded dynamic random access memory (eDRAM) cell. The eDRAM cell and the nanosheet device are connected by a doped polycrystalline semiconductor material that is formed during the epitaxial growth of doped single crystalline semiconductor source/drain regions of the nanosheet device. An eDRAM cut mask is used to remove unwanted semiconductor material from regions not including the eDRAM cell and the nanosheet device.

In one aspect of the present application, a semiconductor structure is provided. In one embodiment, the semiconductor structure includes a nanosheet device including a plurality of stacked and suspended semiconductor channel material nanosheets located above a topmost semiconductor layer of a semiconductor-on-insulator (SOI) substrate, a functional gate structure surrounds a portion of each semiconductor channel material nanosheet of the plurality of stacked and suspended semiconductor channel material nanosheets, and a source/drain (S/D) region composed of a doped single crystalline semiconductor material is located on each side of the functional gate structure and physically contacting sidewalls of each semiconductor channel material nanosheet of the plurality of stacked and suspended semiconductor channel material nanosheets. An embedded dynamic access memory (eDRAM) cell is laterally adjacent to the nanosheet device and is located in a trench that is present in the SOI substrate. A strap composed of a doped polycrystalline semiconductor material connects a polycrystalline semiconductor material electrode of the eDRAM cell to the one of the S/D regions of the nanosheet device.

In another aspect of the present application, a method of forming a semiconductor structure is provided. In one embodiment, the method includes forming an embedded dynamic access memory (eDRAM) cell within a trench that is formed into a semiconductor-on-insulator (SOI) substrate, wherein the eDRAM cell includes a polycrystalline semiconductor material electrode. Next, a sacrificial semiconductor plug is formed atop the eDRAM cell and within the trench. A nanosheet stack of alternating nanosheets of a sacrificial semiconductor material nanosheet and a semiconductor channel material nanosheet is formed on a topmost semiconductor layer of the SOI substrate and the sacrificial semiconductor plug, wherein a sacrificial gate structure and a dielectric spacer material layer straddle over the nanosheet stack. The sacrificial semiconductor plug is then removed from the trench to physically expose the polycrystalline semiconductor material electrode of the eDRAM cell. A doped single crystalline semiconductor material is formed on a physically exposed surface of the topmost semiconductor layer of the SOI substrate and sidewalls of each semiconductor channel material nanosheet, while simultaneously forming a doped polycrystalline semiconductor material from the physically exposed polycrystalline semiconductor material electrode of the eDRAM cell. An eDRAM cut mask is formed above the nanosheet stack and the eDRAM cell, and thereafter, the doped polycrystalline semiconductor material not protected by the eDRAM cut mask is removed, while a portion of the doped polycrystalline semiconductor material remains beneath the eDRAM mask and is in contact with the doped single crystalline semiconductor material. The eDRAM mask is then removed and thereafter the sacrificial gate structure and each sacrificial semiconductor material nanosheet are removed, and a functional gate structure is formed around exposed surfaces of each semiconductor channel material nanosheet.

DETAILED DESCRIPTION

Figure 1A:
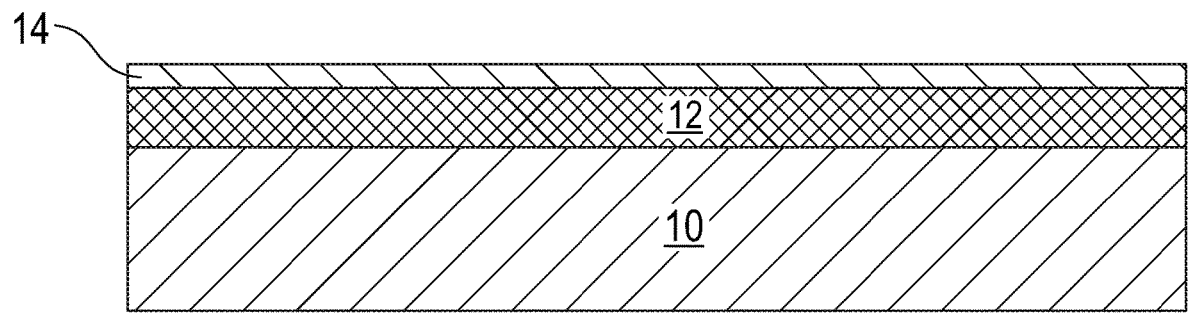
FIG. 1A is a cross sectional view of an exemplary semiconductor structure including a semiconductor-on-insulator (SOI) substrate that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application forms and connects an eDRAM cell during the formation of a nanosheet device. One advantage is space saving. Notably, space reduction can be enabled in the present application by forming a doped polycrystalline semiconductor material strap during the epitaxial growth of doped single crystalline semiconductor source/drain regions of the nanosheet device in conjunction with using an eDRAM cut mask. The cut mask removes unwanted semiconductor material in regions not containing the eDRAM cell and the nanosheet device thus eliminating eDRAM to eDRAM shorts. Also, the present application permits for the formation of a larger size strap which has low resistance, while reducing lateral overgrowth of semiconductor material.

Figure 1B:
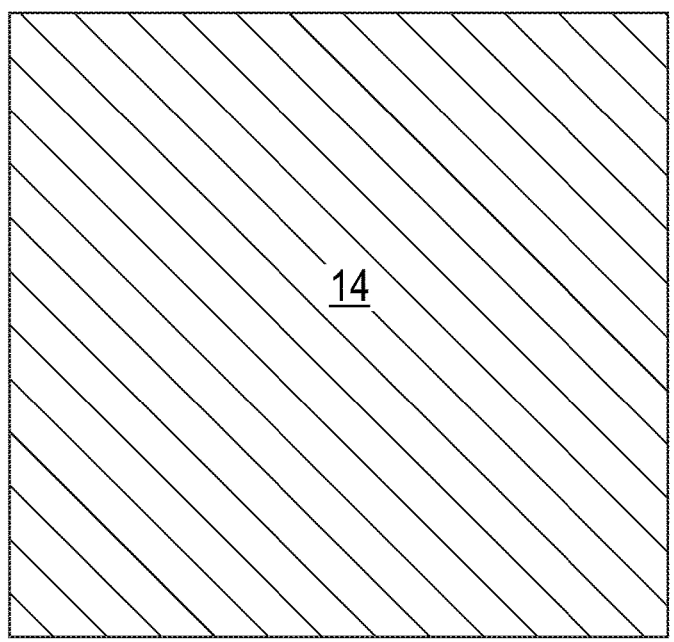
FIG. 1B is a top-down view of the exemplary semiconductor structure of FIG. 1A.

Referring first to FIGS. 1A-1B, there are illustrated an exemplary semiconductor structure including a semiconductor-on-insulator (SOI) substrate (10/12/14) that can be employed in the present application. The SOI substrate includes a semiconductor material layer 10, an insulator layer 12 and a topmost semiconductor material layer 14. In the drawings of the present application, only a portion of the semiconductor layer 10 is shown.

The term "semiconductor" as used throughout the present application denotes any material having semiconducting properties. Examples of semiconductor materials include silicon (Si), germanium (Ge), a silicon germanium alloy (SiGe), a III-V compound semiconductor or a II-VI compound semiconductor. In some embodiments of the present application, the semiconductor material layer 10 and the topmost semiconductor material layer 14 of the SOI substrate may be composed of a same semiconductor material. In one example, the semiconductor material layer 10 and the topmost semiconductor material layer 14 are both composed of silicon. In other embodiments of the present application, the semiconductor material layer 10 and the topmost semiconductor material layer 14 of the SOI substrate may be composed of different semiconductor materials.

The semiconductor material layer 10 and the topmost semiconductor material layer 14 of the SOI substrate may have the same or different crystal orientation. For example, the crystal orientation of the handle substrate 10 and/or the semiconductor material layer 14 may be {100}, {110}, or {111}. Other crystallographic orientations besides those specifically mentioned can also be used in the present application. At least the topmost semiconductor layer 14 of the SOI substrate is single crystalline, the semiconductor material layer 10 of the SOI substrate may be single crystalline, polycrystalline, or amorphous.

The insulator layer 12 of the SOI substrate may be a crystalline or non-crystalline oxide and/or nitride. In one embodiment, the insulator layer 12 is an oxide such as, for example, silicon dioxide. In another embodiment, the insulator layer 12 is a nitride such as, for example, boron nitride. In a further embodiment, the insulator layer 12 is a multi-layered stack including in any order, a layer of boron nitride and a layer of silicon dioxide.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the topmost semiconductor material layer 14 to a layer having a thickness that is more desirable.

The topmost semiconductor material layer 14 of the SOI substrate typically has a thickness from 10 nm to 100 nm. The insulator layer 12 of the SOI substrate typically has a thickness from 1 nm to 200 nm. The thickness of the semiconductor material layer 10 of the SOI substrate is typically from 3 µm to 100 µm. Other thicknesses for the semiconductor material layer 10, the insulator layer 12, and the topmost semiconductor material layer 14 besides those mentioned herein are contemplated and can be used in the present application.

At least an upper portion of the semiconductor material layer 10, in which the eDRAM cell will be subsequently formed, is doped with an n-type dopant. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within at least the upper portion of the semiconductor material layer 10 is typically from $5\times10^{18}$ atoms/cm$^3$ to $5\times10^{19}$ atoms/cm$^3$. The topmost semiconductor material layer 14 may be doped or undoped.

Figure 2A:
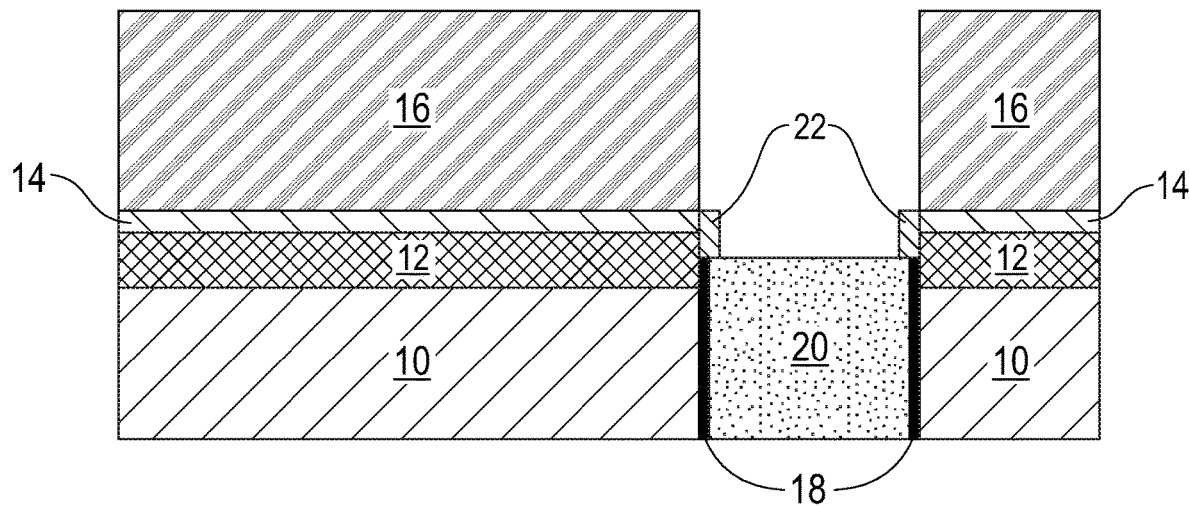
FIG. 2A is a cross sectional view of the exemplary semiconductor structure of FIGS. 1A-1B after forming an eDRAM cell including a polycrystalline semiconductor material electrode in a trench that is formed into the SOI substrate.
Figure 2B:
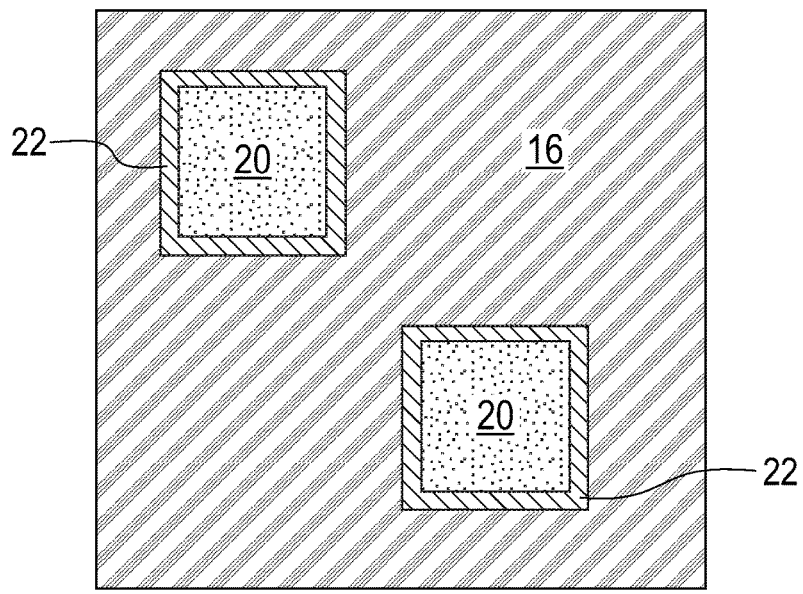
FIG. 2B is a top-down view of the exemplary semiconductor structure of FIG. 2A.

Referring now to FIGS. 2A-2B, there are illustrated the exemplary semiconductor structure of FIGS. 1A-1B after forming an eDRAM cell including a polycrystalline semiconductor material electrode 20. The eDRAM cell also includes a node dielectric layer 18 and a collar dielectric material 22. The doped upper portion of the semiconductor material layer 10, which surrounds the trench containing the polycrystalline semiconductor material electrode 20, forms another electrode of the eDRAM cell. The polycrystalline semiconductor material electrode 20 is entirely separated from the doped upper portion of the semiconductor material layer 10 by the node dielectric layer 18.

The eDRAM cell can be formed utilizing any conventional eDRAM process that is well known to those skilled in the art. For example, the eDRAM cell can be formed by first providing a hard mask 16 having an opening on the topmost semiconductor material layer 14 of the SOL The hard mask 16 includes any hard mask material such as, for example, silicon nitride. The hard mask 16 may be formed by deposition of a continuous layer of the hard mask material, followed by lithography and etching. The opening that is formed in the hard mask 16 defines an area in which the eDRAM cell will be formed. A trench is then into the SOI substrate which extends entirely through the topmost semiconductor layer 14, entirely through the insulator layer 12, and into the doped upper portion of the semiconductor material layer 10. The depth of the trench may be from 1 µm to 10 µm.

A node dielectric material can then be formed into the trench. The node dielectric material can include a high-k material having a dielectric constant greater than silicon dioxide. Exemplary high-k dielectrics that can be used as the node dielectric include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The node dielectric material can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the node dielectric material can have a thickness in a range from 1 nm to 10 nm. Other thicknesses that are lesser than, or greater than, the aforementioned thickness range can also be employed for the node dielectric material.

A polycrystalline semiconductor material is then formed on the node dielectric material. The polycrystalline semiconductor material is doped with the same conductivity type dopant (i.e., n-type) as the upper portion of the semiconductor material layer 10. The polycrystalline semiconductor material may include a same, or different, semiconductor material as the semiconductor material layer 10. In one embodiment, the polycrystalline semiconductor material and the semiconductor material layer 10 are both composed of n-doped silicon. The amount of n-type dopant within the polycrystalline semiconductor material is typically from $1\times10^{19}$ atoms/cm$^3$ to $1\times10^{21}$ atoms/cm$^3$. The polycrystalline semiconductor material may be formed utilizing any deposition process.

The node dielectric material and the polycrystalline semiconductor material can then be recessed to provide node dielectric layer 18 and polycrystalline semiconductor material electrode 20, respectively, and then the collar dielectric material 22, such as a collar oxide, is formed along physically exposed sidewalls of the trench. In the illustrated embodiment, the collar dielectric material 22 is formed along sidewalls of the topmost semiconductor material layer 14 and along sidewalls of the insulator layer 12. The collar dielectric material 22 can be formed by deposition and etching.

After formation of the node dielectric layer 18, polycrystalline semiconductor material electrode 20 and collar dielectric material 22, the hard mask 16 is removed utilizing a material removal process that is selective in removing the hard mask material that provides hard mask 16.

Figure 3A:
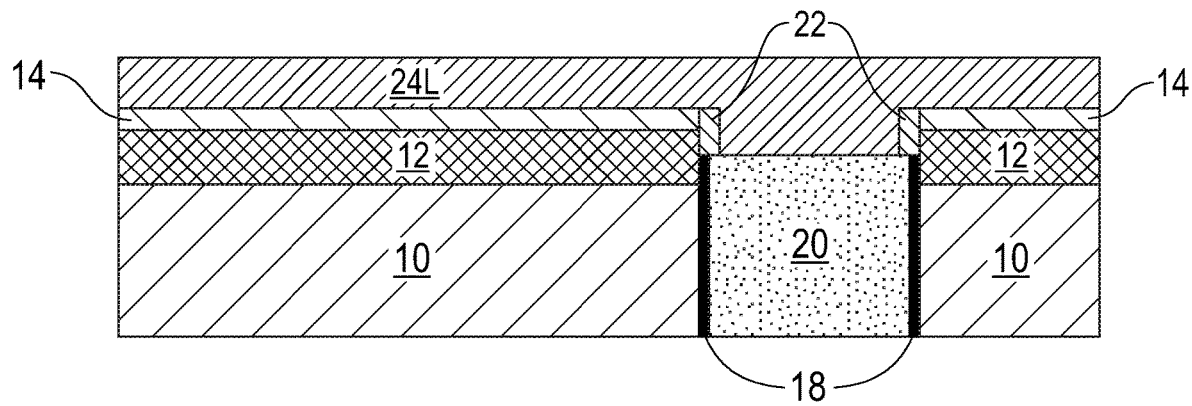
FIG. 3A is a cross sectional view of the exemplary semiconductor structure of FIGS. 2A-2B after forming a sacrificial semiconductor plug layer on a topmost semiconductor material layer of the SOI substrate and within the trench including the eDRAM cell.
Figure 3B:
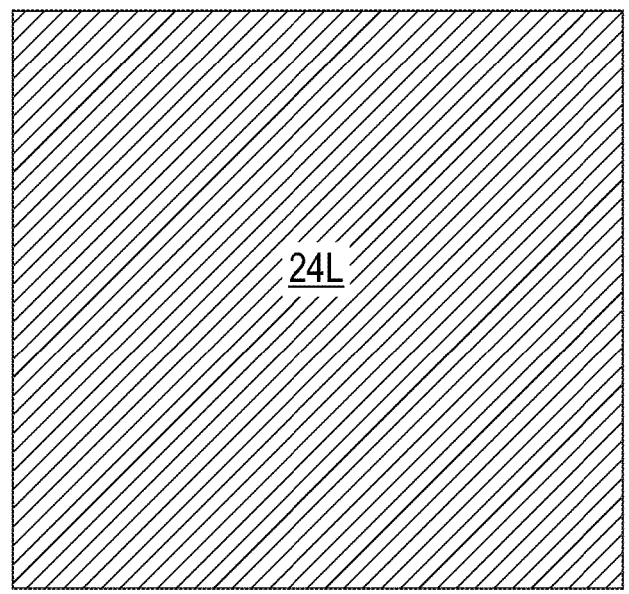
FIG. 3B is a top-down view of the exemplary semiconductor structure of FIG. 3A.

Referring now to FIGS. 3A-3B, there are illustrated the exemplary semiconductor structure of FIGS. 2A-2B after forming a sacrificial semiconductor plug layer 24L on the topmost semiconductor material layer 14 of the SOI substrate and within the trench including the eDRAM cell. The sacrificial semiconductor plug layer 24L is composed of a semiconductor material that is different from the semiconductor material that provides the topmost semiconductor layer 14 of the SOI substrate and the polycrystalline semiconductor material electrode 20. Thus, the sacrificial semiconductor plug layer 24L has a different etch rate than the topmost semiconductor material layer 14 and the polycrystalline semiconductor material electrode 20. In one example, and when the topmost semiconductor material layer 14 and the polycrystalline semiconductor material electrode 20 are composed of silicon, the sacrificial semiconductor plug layer 24L can be composed of germanium.

The sacrificial semiconductor plug layer 24L can be formed by a deposition process such as, for example, chemical vapor deposition or physical vapor deposition. The sacrificial semiconductor plug layer 24L typically has a thickness from 50 nm to 250 nm. The sacrificial semiconductor plug layer 24L is used to seal the trench containing the eDRAM cell.

Figure 4A:
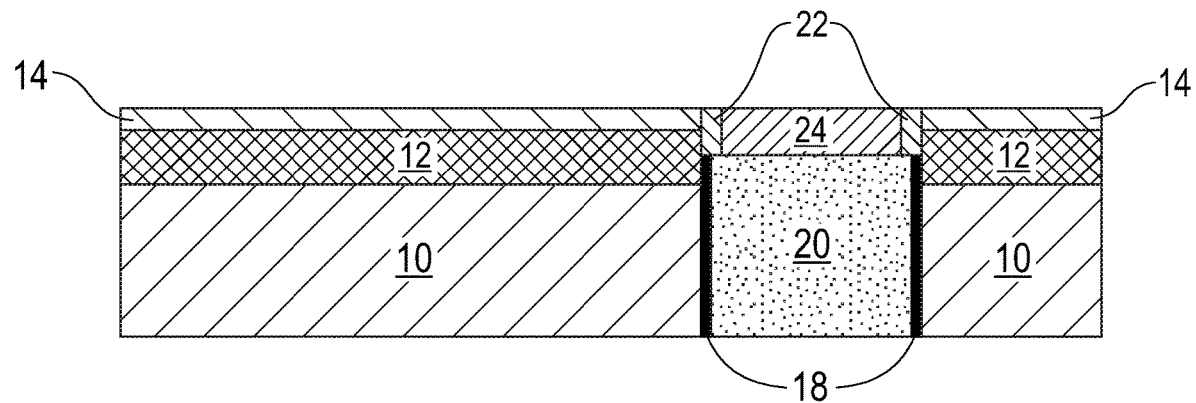
FIG. 4A is a cross sectional view of the exemplary semiconductor structure of FIGS. 3A-3B after removing the sacrificial semiconductor plug layer atop the topmost semiconductor material layer of the SOI substrate, while maintaining a sacrificial semiconductor plug within the trench that includes the eDRAM cell.
Figure 4B:
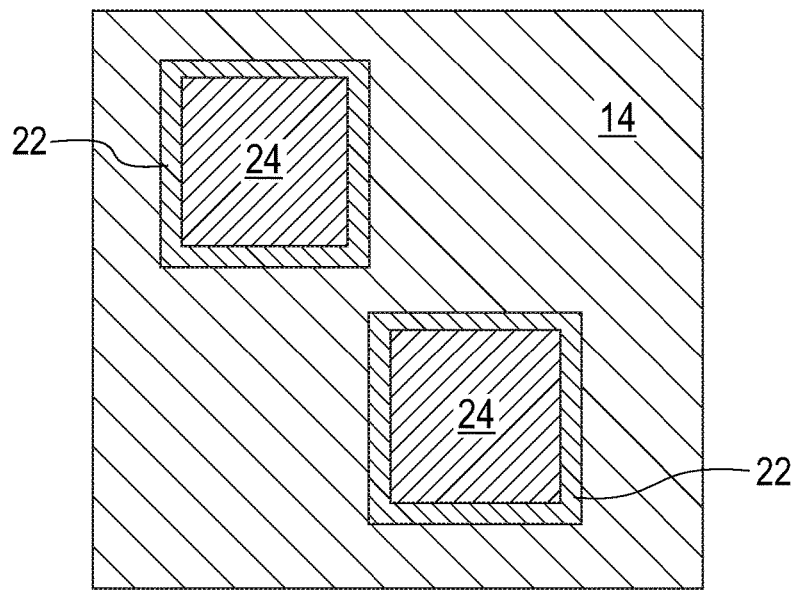
FIG. 4B is a top-down view of the exemplary semiconductor structure of FIG. 4A.

Referring now to FIGS. 4A-4B, there are illustrated the exemplary semiconductor structure of FIGS. 3A-3B after removing the sacrificial semiconductor plug layer 24L atop the topmost semiconductor material layer 14 of the SOI substrate, while maintaining a sacrificial semiconductor plug 24 within the trench that includes the eDRAM cell. The sacrificial semiconductor plug 24 includes a remaining portion of the sacrificial semiconductor plug layer 24L. The removal of the sacrificial semiconductor plug layer 24L atop the topmost semiconductor material layer 14 of the SOI substrate can be performed utilizing any material removal process such as, for example, chemical mechanical polishing. At this point of the present application, the sacrificial semiconductor plug 24 has a topmost surface that is coplanar with a topmost surface of the collar dielectric material 22 and the topmost semiconductor layer 14.

Figure 5A:
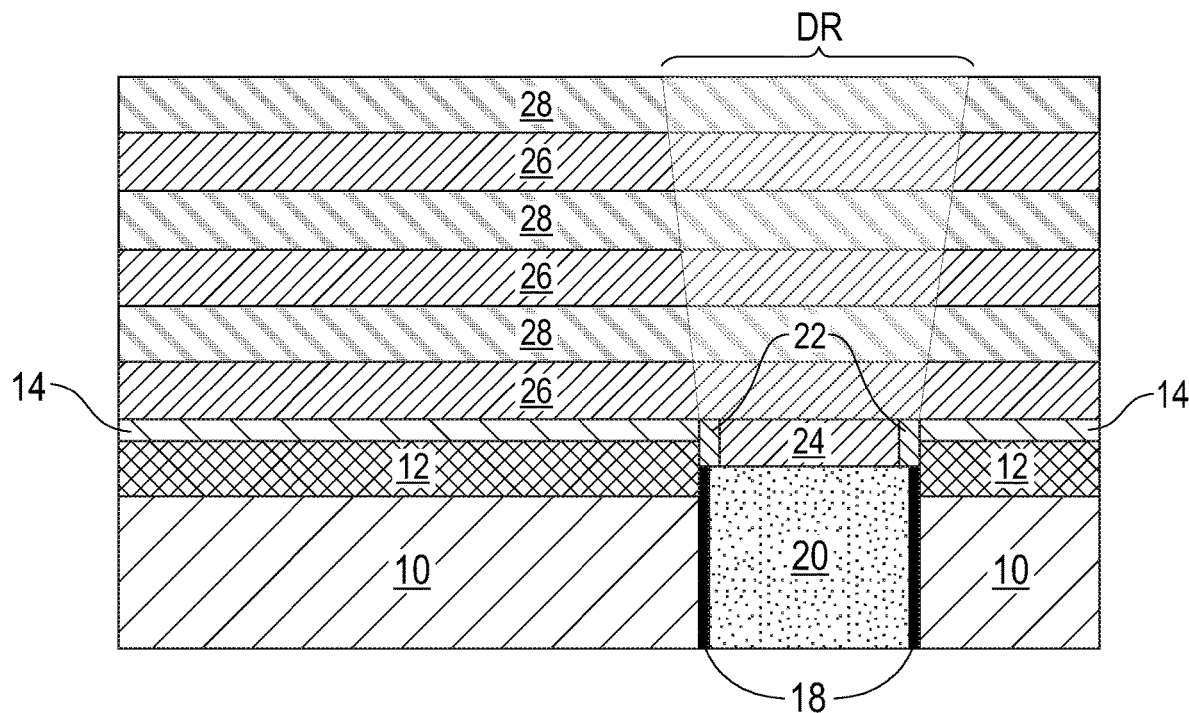
FIG. 5A is a top-down view of the exemplary semiconductor structure of FIGS. 4A-4B after forming a semiconductor material stack structure comprising a vertical stack of alternating layers of a sacrificial semiconductor material and a semiconductor channel material.
Figure 5B:
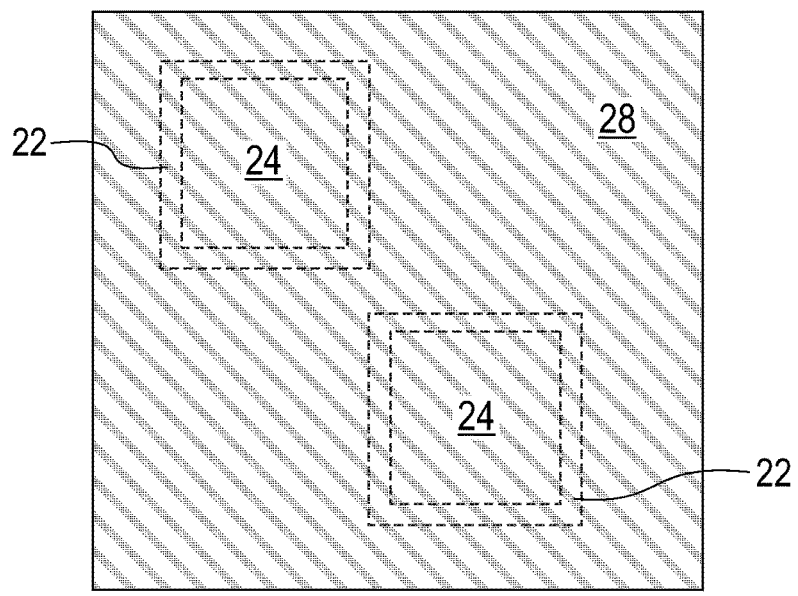
FIG. 5B is a top-down view of the exemplary semiconductor structure of FIG. 5A.

Referring now to FIGS. 5A-5B, there are illustrated the exemplary semiconductor structure of FIGS. 4A-4B after forming a semiconductor material stack structure comprising a vertical stack of alternating layers of a sacrificial semiconductor material 26 and a semiconductor channel material 28. Although a single semiconductor material stack structure is described and illustrated, a plurality of material stack structures each containing a vertical stack of alternating layers of a sacrificial semiconductor material 26 and a semiconductor channel material 28 can be formed. In such an embodiment, each semiconductor material stack structure is orientated parallel to one another.

The formation of the semiconductor material stack structure includes forming a semiconductor material stack upon the topmost semiconductor material layer 14 of the SOI substrate, the collar dielectric material 22, and the sacrificial semiconductor plug 24 and then patterning the semiconductor material stack to form the semiconductor material stack structure. Patterning may be performed by lithography and etching or any other patterning method known to those skilled in the art including, for example, a sidewall-image transfer (SIT) process.

The region of the semiconductor material stack structure that is formed upon the sacrificial semiconductor plug 24 and the collar dielectric material 22 is defective. By "defective" it is meant that a material(s) is full of dislocation defects, or it is polycrystalline, since the underlying surface is polycrystalline. The defective region of the semiconductor material stack structure is labeled as DR (i.e., defective region) in the drawings of the present application.

The term "semiconductor material stack structure" denotes a continuous structure including a pair of vertical sidewalls that are parallel to each other. As used herein, a surface is "vertical" if there exists a vertical plane from which the surface does not deviate by more than three times the root mean square roughness of the surface. The semiconductor material stack structure may have a height from 50 nm to 200 nm, a width from 30 nm to 200 nm, and a length from 100 nm to 2000 nm. Other heights and/or widths and/or lengths may also be used as the dimensions of material stack structure.

The semiconductor material stack that is employed in forming the semiconductor material stack structure is composed of alternating layers of the sacrificial semiconductor material 26 and the semiconductor channel material 28 which alternate one atop the other; the alternating layers of the sacrificial semiconductor material 26 and the semiconductor channel material 28 are also present in the material stack structure. In one example, the semiconductor material stack includes three layers of sacrificial semiconductor material 26 and three layers of semiconductor channel material 28. The semiconductor material stack that can be employed in the present application is not limited to such a semiconductor material stack. Instead, the semiconductor material stack can include any number of layers of sacrificial semiconductor material and corresponding layers of semiconductor channel material.

Each layer of sacrificial semiconductor material 26 is composed of a semiconductor material which differs in composition from the topmost semiconductor material layer 14 of the SOI and the sacrificial semiconductor plug 24. In one embodiment, each layer of sacrificial semiconductor material 26 is composed of a silicon germanium alloy. Each layer of sacrificial semiconductor material 26 can be formed utilizing an epitaxial growth (or deposition process).

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. It is noted that the various layer of sacrificial semiconductor material 26 and semiconductor channel material 28 that are located outside the defective region are single crystalline.

Examples of various epitaxial growth process apparatuses that can be employed in the present application include, e.g., reduced pressure chemical vapor deposition (RPCVD), low pressure chemical vapor deposition (LPCVD), rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the each layer of sacrificial semiconductor material 26 can be performed utilizing well known precursor gas or precursor gas mixture. Carrier gases like hydrogen, nitrogen, helium and argon can also be used.

Each layer of semiconductor channel material 28 is composed of a semiconductor material that has a different etch rate than the semiconductor material that provides each layer of sacrificial semiconductor material 26. In one example, each layer of semiconductor channel material 28 is composed of Si or a III-V compound semiconductor, while each layer of sacrificial semiconductor material 26 is composed of a silicon germanium alloy. Each layer of semiconductor channel material 28 can be formed utilizing an epitaxial growth (or deposition process) as defined above. The epitaxial growth of the each layer of semiconductor channel material 28 can be performed utilizing well known precursor gas or precursor gas mixture. Carrier gases like hydrogen, nitrogen, helium and argon can also be used. The semiconductor material stack can be formed by sequential epitaxial growth of alternating layers of the sacrificial semiconductor material 26 and the semiconductor channel material 28.

Each layer of sacrificial semiconductor material 26 may have a thickness from 5 nm to 12 nm, while each layer of semiconductor channel material 28 may have a thickness from 5 nm to 12 nm. Each layer of sacrificial semiconductor material 26 may have a thickness that is the same as, or different from, a thickness of each layer of semiconductor channel material 28.

Figure 6A:
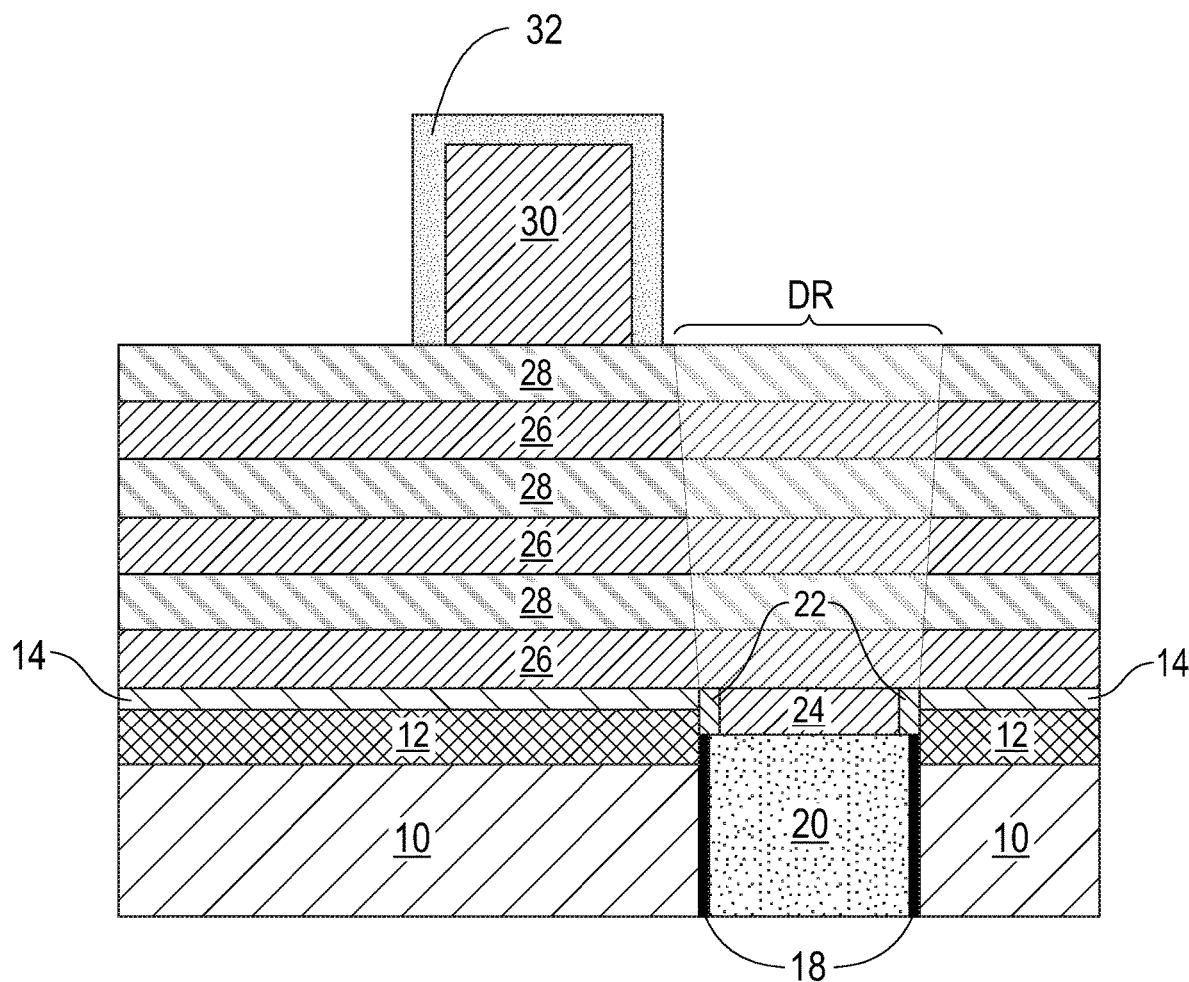
FIG. 6A is a cross sectional view of the exemplary semiconductor structure of FIGS. 5A-5B after forming a sacrificial gate structure and a dielectric spacer material layer on a surface of the semiconductor material stack structure.
Figure 6B:
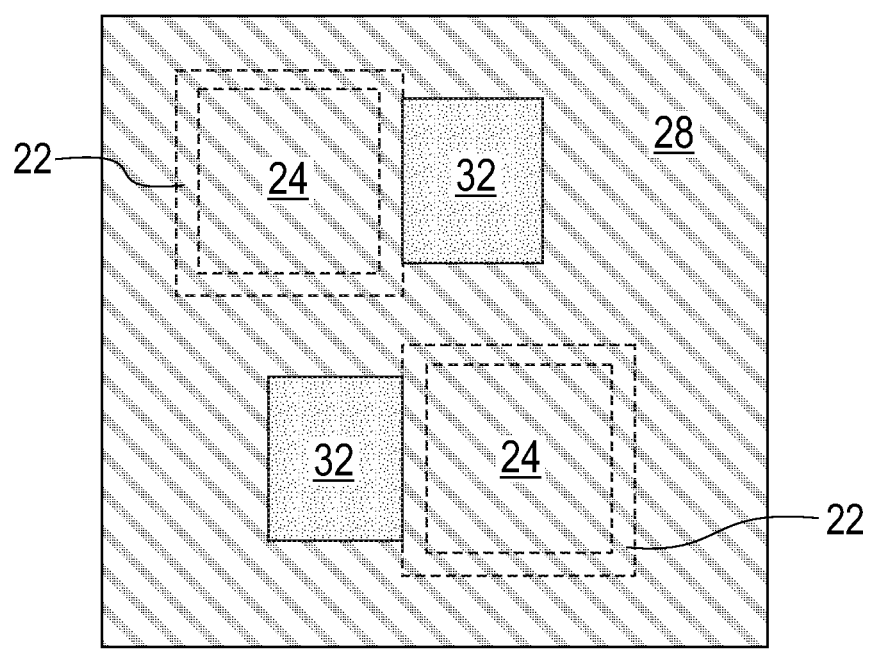
FIG. 6B is a top-down view of the exemplary semiconductor structure of FIG. 6A.

Referring now to FIGS. 6A-6B, there are illustrated the exemplary semiconductor structure of FIGS. 5A-5B after forming a sacrificial gate structure 30 and a dielectric spacer material layer 32 on a surface of the material stack structure; the sacrificial gate structure 30 and the dielectric spacer material layer 32 are located laterally adjacent, but in proximity to, the eDRAM cell. In the illustrated embodiment, a single sacrificial gate structure 30 is shown by way of one example. The present application is not limited to forming a single sacrificial gate structure 30, but instead contemplates embodiments in which a plurality of sacrificial gate structures are formed on the semiconductor material stack structure.

The sacrificial gate structure 30 that is formed is located on a first side and a second side of the semiconductor material stack structure (not shown), and spans across a topmost surface of a portion of the semiconductor material stack structure. The sacrificial gate stack 30 thus straddles over a portion of the semiconductor material stack structure. A dielectric spacer material layer 32 is present on the exposed surfaces of the sacrificial gate structure 30.

The sacrificial gate structure 30 may include a single sacrificial material or a stack of two or more sacrificial materials (i.e., sacrificial gate structure 30 includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the sacrificial gate structure 30.

The dielectric spacer material layer 32 can be formed by deposition of a dielectric spacer material and then etching the dielectric spacer material. One example of a dielectric spacer material that may be employed in the present application is silicon nitride. The deposition process that can be employed in providing the dielectric spacer material includes, for example, chemical vapor deposition (CVD), plasma enhanced chemical vapor deposition (PECVD), or physical vapor deposition (PVD). The etch used to etch the deposited dielectric spacer material may comprise a dry etching process such as, for example, reactive ion etching.

Figure 7A:
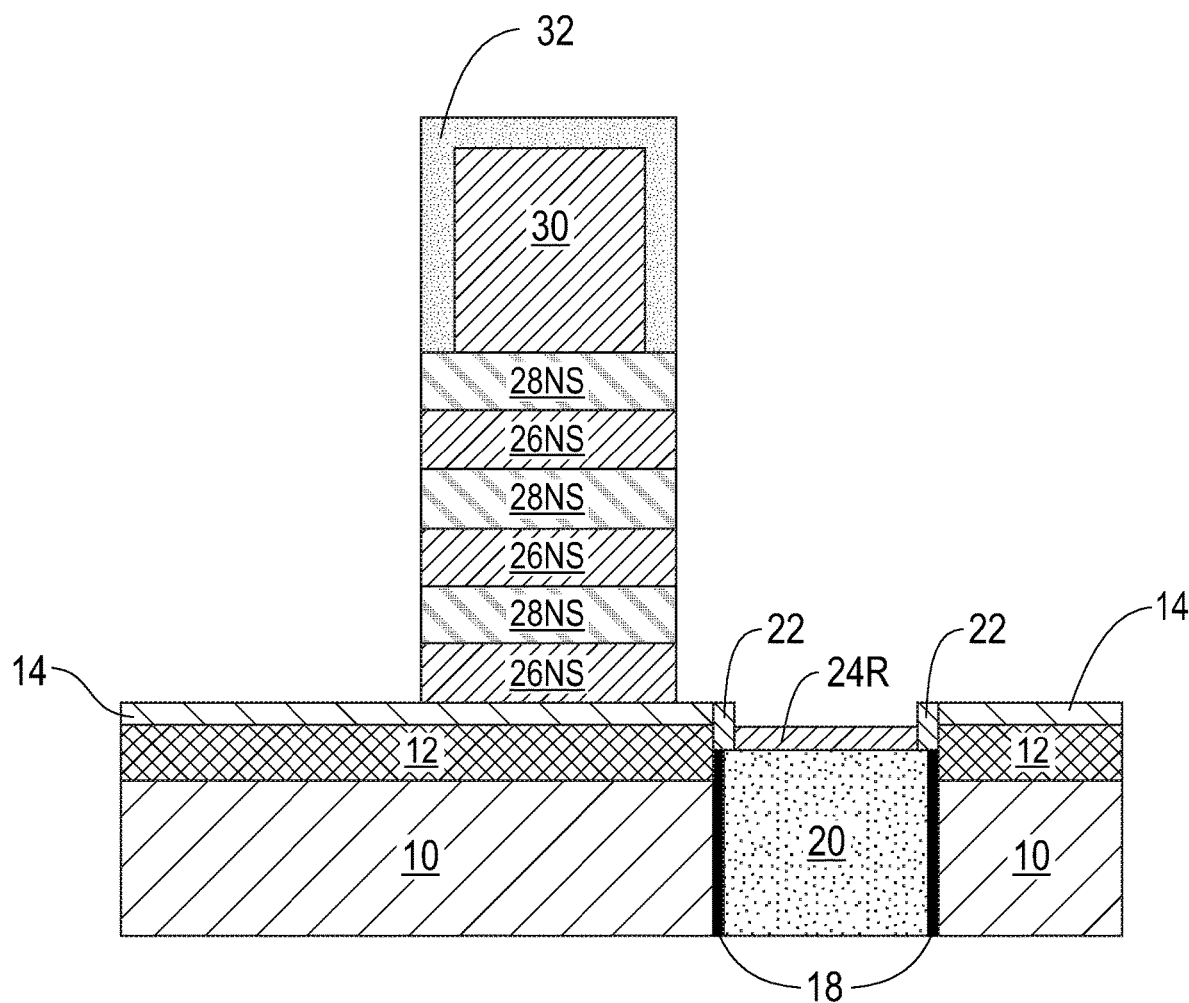
FIG. 7A is a cross sectional view of the exemplary semiconductor structure of FIGS. 6A-6B after forming a nanosheet stack of alternating nanosheets of the sacrificial semiconductor material and the semiconductor channel material under the sacrificial gate structure and the dielectric spacer material layer by removing physically exposed portions of the semiconductor material stack structure that are not protected by sacrificial gate structure and the dielectric spacer material layer.
Figure 7B:
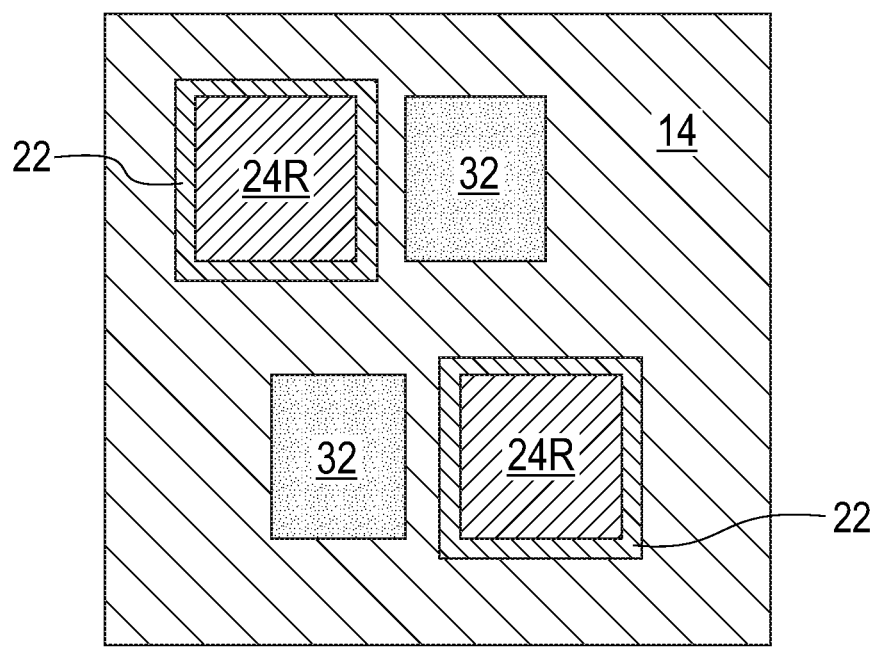
FIG. 7B is a top-down view of the exemplary semiconductor structure of FIG. 7A.

Referring now to FIGS. 7A-7B, there are illustrated the exemplary semiconductor structure of FIGS. 6A-6B after forming a nanosheet stack of alternating nanosheets of the sacrificial semiconductor material 26NS and the semiconductor channel material 28NS under the sacrificial gate structure 30 and the dielectric spacer material layer 32 by removing physically exposed portions of the semiconductor material stack structure that are not protected by sacrificial gate structure 30 and the dielectric spacer material layer 32. It is noted that the DR region of the semiconductor material stack structure is removed at this point of the present application.

The removal of the physically exposed portions of the semiconductor material stack structure not covered by the sacrificial gate structure 30 and the dielectric spacer material layer 32 can be performed utilizing an anisotropic etching process such as, for example, reactive ion etching (RIE). Portions of the semiconductor material stack structure remain beneath the sacrificial gate structure 30 and the dielectric spacer material layer 32. The remaining portion of the semiconductor material stack structure that is presented beneath the sacrificial gate structure 30 and the dielectric spacer material layer 32 can be referred to as a nanosheet stack.

Nanosheet stack includes alternating nanosheets of remaining portions of each layer of sacrificial semiconductor material 26 (referred to herein as sacrificial semiconductor material nanosheet 26NS) and remaining portions of each layer of semiconductor channel material 28 (referred to herein as semiconductor channel material nanosheet 28NS).

Each nanosheet, i.e., sacrificial semiconductor material nanosheet 26NS and semiconductor channel material nanosheet 28NS, that constitutes the nanosheet stack has a thickness as mentioned above for the individual layers of sacrificial semiconductor material 26 and layers of semiconductor channel material 28 of the material stack structure, and a width from 20 nm to 60 nm. At this point of the present application and as illustrated in FIG. 7A, the sidewalls of each sacrificial semiconductor material nanosheet 26NS are vertically aligned to sidewalls of each semiconductor channel material nanosheet 26NS, and the vertically aligned sidewalls of the nanosheet stack are vertically aligned to an outmost sidewall of the dielectric spacer material layer 32.

In some embodiments of the present application, the sacrificial semiconductor plug 24 can be recessed during the formation of the nanosheet stack. The remaining sacrificial semiconductor plug layer 24 may be referred to as recessed sacrificial semiconductor plug 24R. The recessed sacrificial semiconductor plug 24R has a topmost surface that is lower than a topmost surface of the topmost semiconductor layer 14 of the SOI substrate.

Figure 8A:
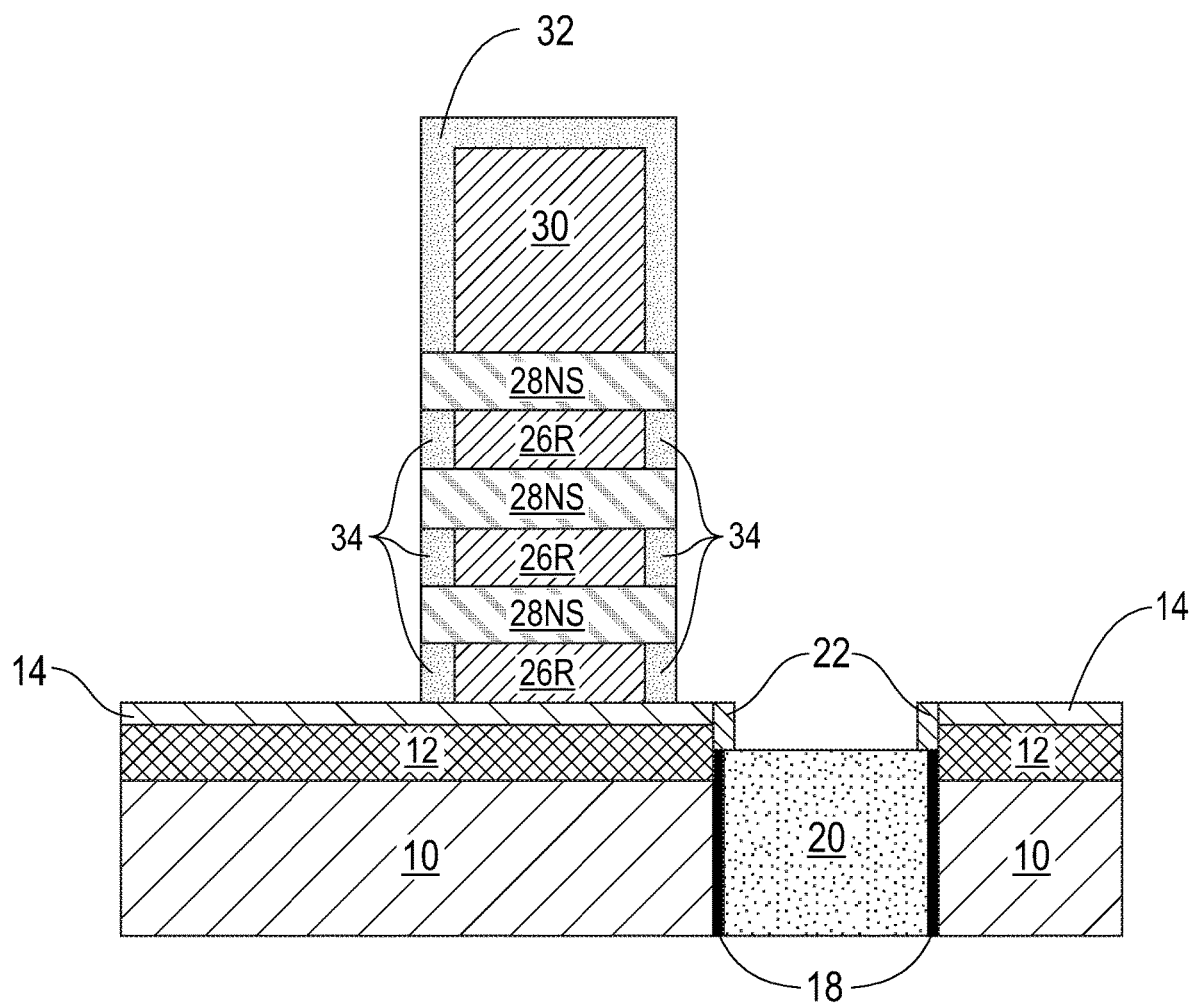
FIG. 8A is a cross sectional view of the exemplary semiconductor structure of FIGS. 7A-7B after recessing each sacrificial semiconductor material nanosheet, forming an inner dielectric spacer on exposed sidewalls of each recessed sacrificial semiconductor material nanosheet, and removing the sacrificial semiconductor plug from the trench to physically expose the polycrystalline semiconductor material electrode of the eDRAM cell.
Figure 8B:
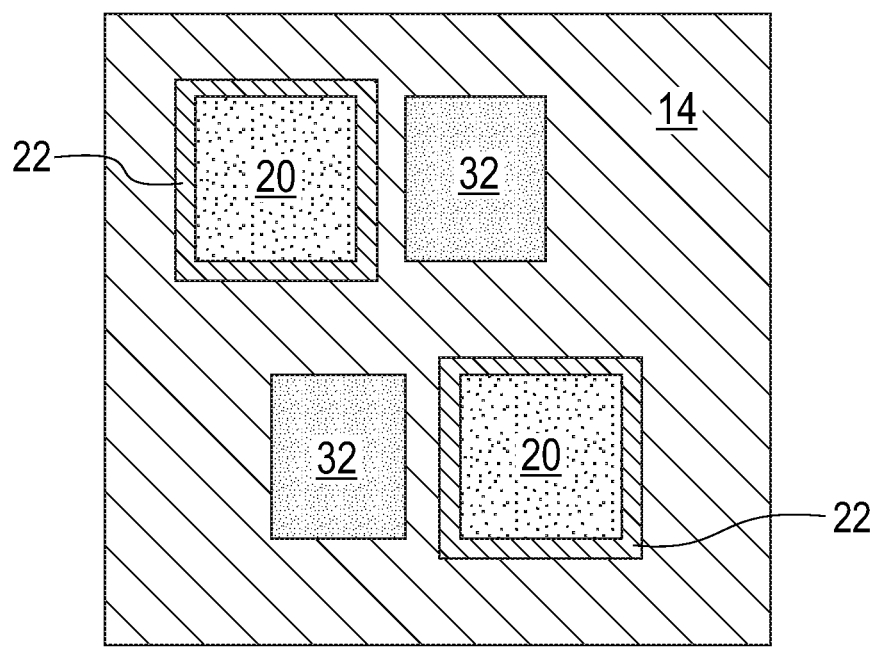
FIG. 8B is a top-down view of the exemplary semiconductor structure of FIG. 8A.

Referring now to FIGS. 8A-8B, there are illustrated the exemplary semiconductor structure of FIGS. 7A-7B after recessing each sacrificial semiconductor material nanosheet 26NS, forming an inner dielectric spacer 34 on exposed sidewalls of each recessed sacrificial semiconductor material nanosheet 26R, and removing the sacrificial semiconductor plug 24 (or recessed sacrificial semiconductor plug 24R) from the trench to expose the polycrystalline semiconductor material electrode 20 of the eDRAM cell.

Each recessed sacrificial semiconductor material nanosheet 26R has a width that is less than the original width of each sacrificial semiconductor material nanosheet 26NS. The recessing of each sacrificial semiconductor material nanosheet 26NS provides a gap (not specifically shown) between each neighboring pair of semiconductor channel material nanosheets 28NS within a given nanosheet stack. The recessing of each sacrificial semiconductor material nanosheet 26NS may be performed utilizing a lateral etching process that is selective in removing physically exposed end portions of each sacrificial semiconductor material nanosheet 26NS relative to each semiconductor channel material nanosheet 28NS.

The inner dielectric spacer 34 is then formed within the gaps by depositing an inner dielectric spacer material and etching the deposited inner dielectric spacer material. In one example, the inner dielectric spacer material is composed of silicon nitride. As is shown, the inner dielectric spacer 34 that is formed in the gaps between each neighboring pair of vertically stacked semiconductor channel material nanosheets 286NS directly contacts a sidewall of one of the recessed sacrificial semiconductor material nanosheets 26R. The inner dielectric spacer 34 that is formed in the gap between each neighboring pair of vertically stacked semiconductor channel material nanosheets 28NS has an outermost sidewall that is vertically aligned to the outermost sidewall of each semiconductor channel material nanosheet 28NS.

The sacrificial semiconductor plug 24 (or recessed sacrificial semiconductor plug 24R) can be removed utilizing a wet etch etch process in which a chemical etchant that is selective in removing semiconductor material that provides the sacrificial semiconductor plug 24 can be used. In one example and when germanium is used as the semiconductor material that provides the sacrificial semiconductor plug 24, hydrogen peroxide ($H_2O_2$) can be used to remove the sacrificial semiconductor plug 24 (or recessed sacrificial semiconductor plug 24R) from the structure. The sacrificial semiconductor plug 24 (or recessed sacrificial semiconductor plug 24R) exposes the polycrystalline semiconductor material electrode 20 of the eDRAM cell.

Figure 9A:
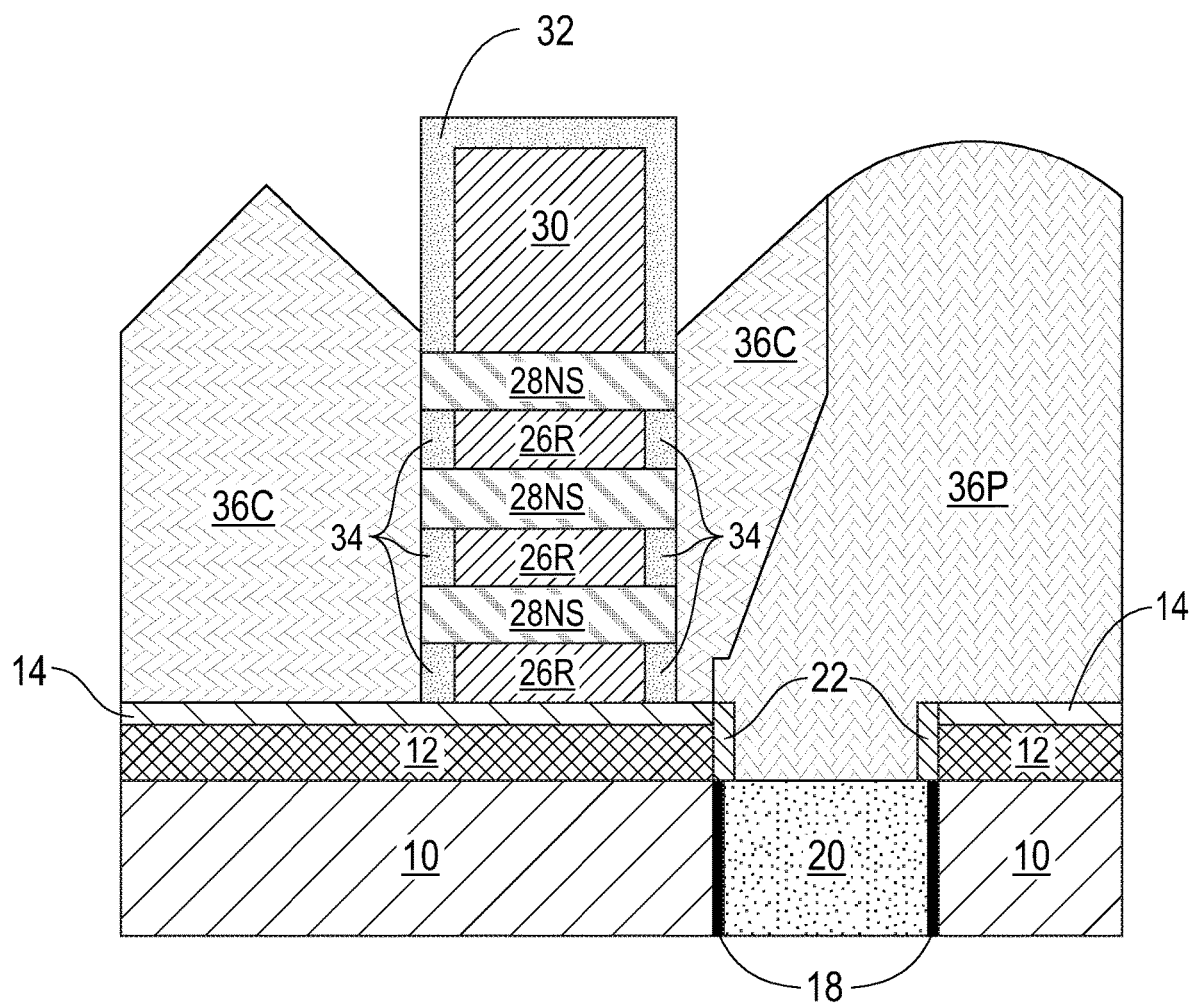
FIG. 9A is a cross sectional view of the exemplary semiconductor structure of FIGS. 8A-8B after epitaxial growth of a doped single crystalline semiconductor material on a physically exposed surface of the topmost semiconductor material layer and sidewalls of each semiconductor channel material nanosheet, and a doped polycrystalline semiconductor material on a physically exposed surface of the polycrystalline semiconductor material electrode of the eDRAM cell.
Figure 9B:
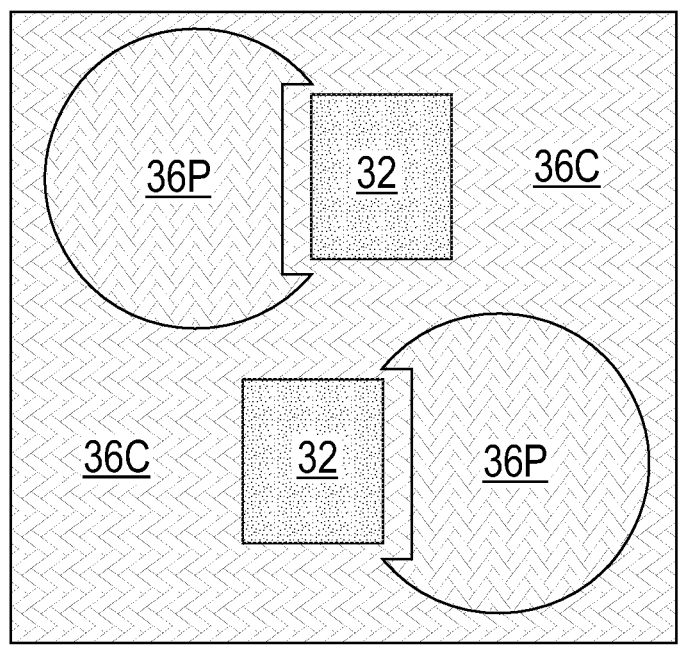
FIG. 9B is a top-down view of the exemplary semiconductor structure of FIG. 9A.

Referring now to FIGS. 9A-9B, there are illustrated the exemplary semiconductor structure of FIGS. 8A-8B after epitaxial growth of a doped single crystalline semiconductor material 36C on a physically exposed surface of the topmost semiconductor material layer 10 and sidewalls of each semiconductor channel material nanosheet 28NS, and a doped polycrystalline semiconductor material 36P on a physically exposed surface the polycrystalline semiconductor material electrode 20 of the eDRAM cell.

The doped single crystalline semiconductor material 36C and the doped polycrystalline semiconductor material 36P are formed simultaneously utilizing a single epitaxial growth process, as defined above. The epitaxial growth process will form the doped single crystalline semiconductor material 36C on the single crystalline topmost semiconductor material layer 10 and sidewalls of each semiconductor channel material nanosheet 28NS, and doped polycrystalline semiconductor material 36P on a physically exposed surface the polycrystalline semiconductor material electrode 20. The doped single crystalline semiconductor material 36C serves as the source/drain regions of functional gate structure to be subsequently formed, while a portion of the doped polycrystalline semiconductor material 36P will serve as a strap connecting the eDRAM cell to the functional gate structure. The doped polycrystalline semiconductor material 36P grows faster than the doped single crystalline semiconductor material 36C.

The doped single crystalline semiconductor material 36C and the doped polycrystalline semiconductor material 36P include a semiconductor material and an n-type dopant. In some embodiments, the n-type dopant is replaced with a p-type dopant. The semiconductor material that provides the doped single crystalline semiconductor material 36C and the doped polycrystalline semiconductor material 36P can be selected from any semiconductor material that has semiconducting properties. In some embodiments of the present application, the semiconductor material that provides doped single crystalline semiconductor material 36C and the doped polycrystalline semiconductor material 36P may comprise a same semiconductor material as that which provides the semiconductor channel material 28 (and thus each semiconductor channel material nanosheet 28NS). In other embodiments of the present application, the semiconductor material that provides doped single crystalline semiconductor material 36C and the doped polycrystalline semiconductor material 36P may comprise a different semiconductor material than that which provides semiconductor channel material 28 (and thus each semiconductor channel material nanosheet 28NS). For example, the semiconductor material that provides doped single crystalline semiconductor material 36C and the doped polycrystalline semiconductor material 36P may comprise a silicon germanium alloy, while the semiconductor channel material 26 (and thus each semiconductor channel material nanosheet 26NS) may be composed of silicon. The n-type dopant concentration in the doped single crystalline semiconductor material 36C and the doped polycrystalline semiconductor material 36P is typically from $5 \times 10^{20}$ atoms/cm$^3$ to $5 \times 10^{21}$ atoms/cm$^3$.

Figure 10A:
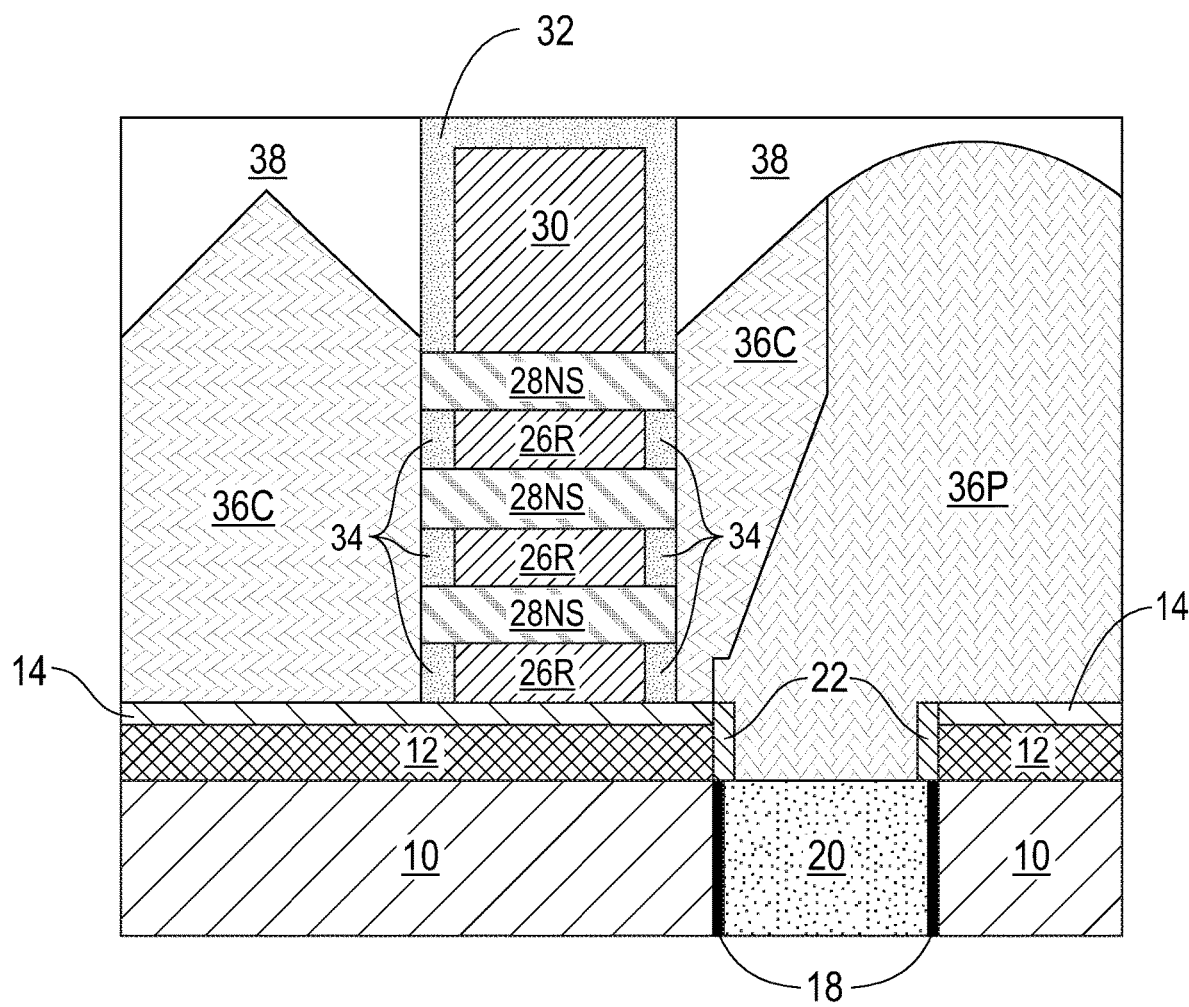
FIG. 10A is a cross sectional view of the exemplary semiconductor structure of FIGS. 9A-9B after forming an interlayer dielectric (ILD) material.
Figure 10B:
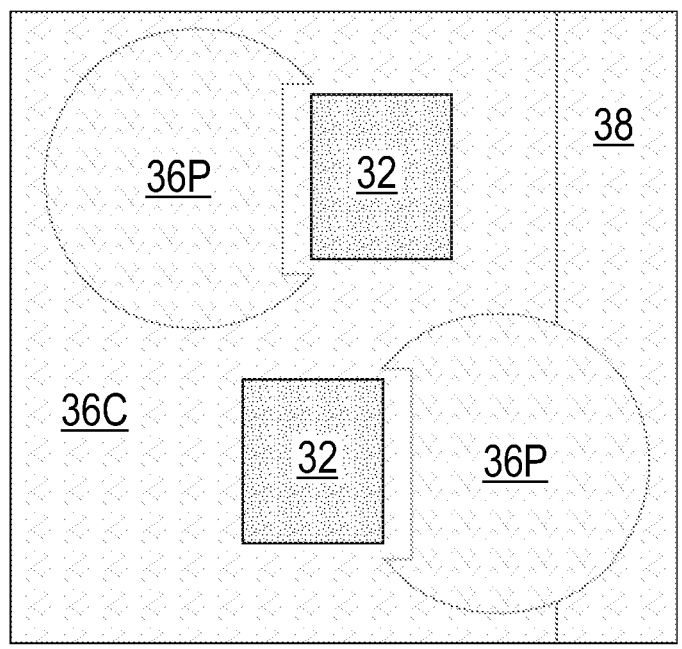
FIG. 10B is a top-down view of the exemplary semiconductor structure of FIG. 10A; in the drawing the ILD material is shown as a transparent layer.

Referring now to FIGS. 10A-10B, there are illustrated the exemplary semiconductor structure of FIGS. 9A-9B after forming an interlayer dielectric (ILD) material 38. ILD material 38 is formed atop the doped crystalline semiconductor material 36C and the doped polycrystalline semiconductor material 36P and laterally surrounding the sacrificial gate structure 30. In some embodiments, the ILD material 38 has a topmost surface that is coplanar with a topmost surface of the dielectric spacer material layer 32.

The ILD material 38 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 38. The use of a self-planarizing dielectric material as the ILD material 38 may avoid the need to perform a subsequent planarizing step.

In one embodiment, the ILD material 38 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 38, a planarization process or an etch back process follows the deposition of the dielectric material that provides the ILD material 38.

Figure 11A:
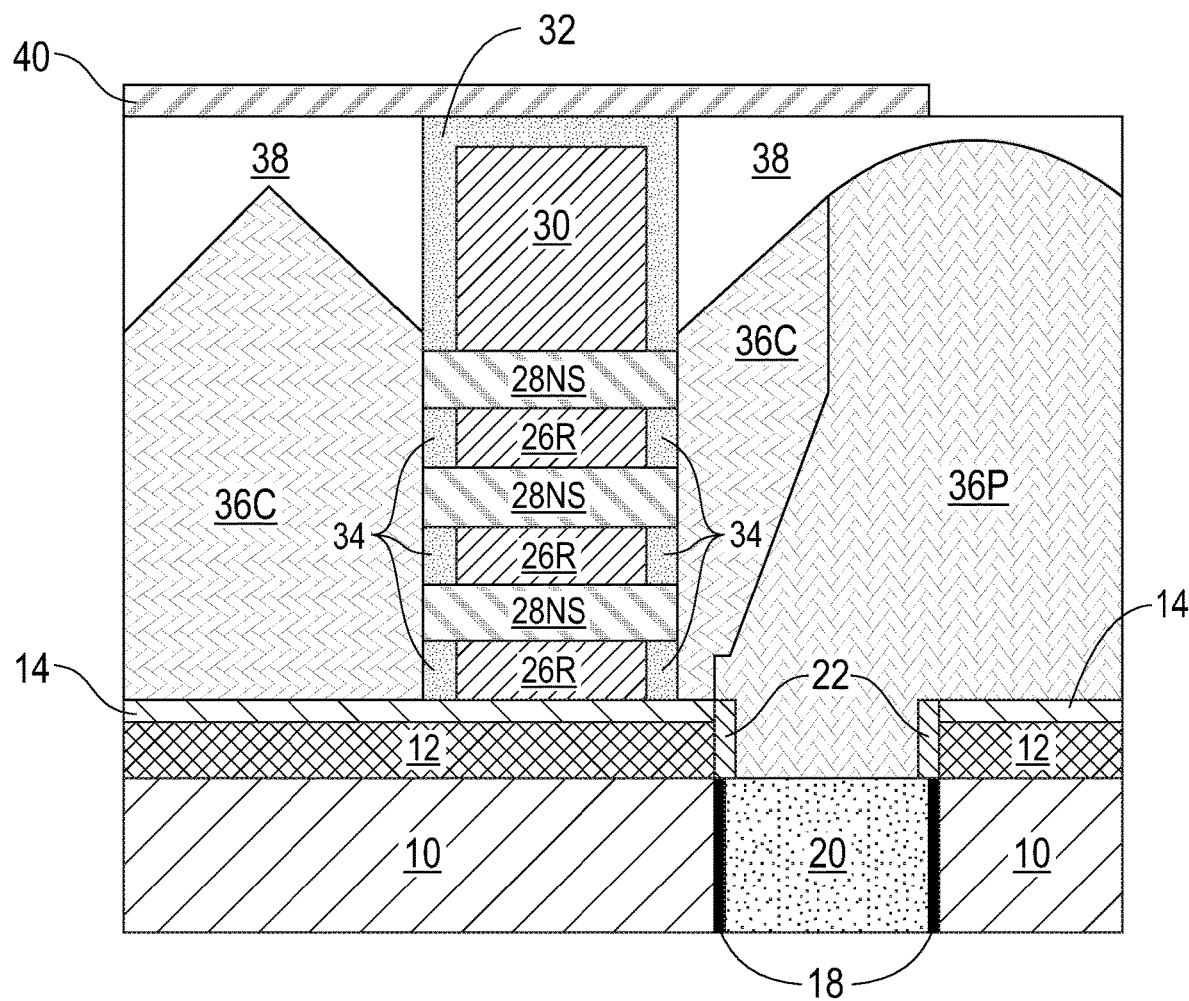
FIG. 11A is a cross sectional view of the exemplary semiconductor structure of FIGS. 10A-10B after forming an eDRAM cut mask.
Figure 11B:
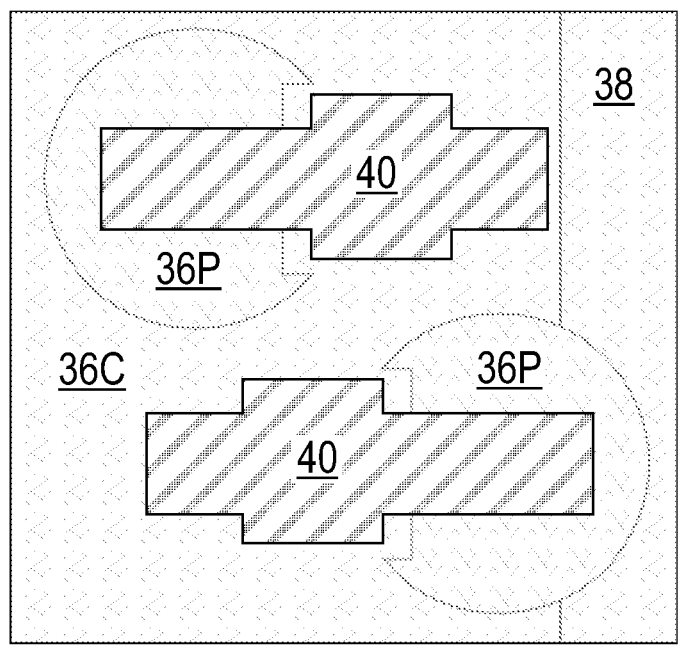
FIG. 11B is a top-down view of the exemplary semiconductor structure of FIG. 11A, in the drawing the ILD material is shown as a transparent layer.

Referring now to FIGS. 11A-11B, there are illustrated the exemplary semiconductor structure of FIGS. 10A-10B after forming an eDRAM cut mask 40. The eDRAM cut mask 40 is formed in regions of the exemplary structure which include the nanosheet stack and the eDRAM cell. The eDRAM cut mask 40 may include a dielectric material that is compositionally different from the ILD material 28 and the spacer dielectric material layer 20. In one example, the eDRAM cut mask 40 is composed of silicon nitride. The eDRAM cut mask 40 can be formed by deposition and etching. The eDRAM cut mask 40 allows one to remove all un-needed semiconductor material outside the regions of the exemplary structure which include the nanosheet stack and the eDRAM. The eDRAM cut mask 40 thus provides a means to remover eDRAM to eDRAM shorts.

Figure 12A:
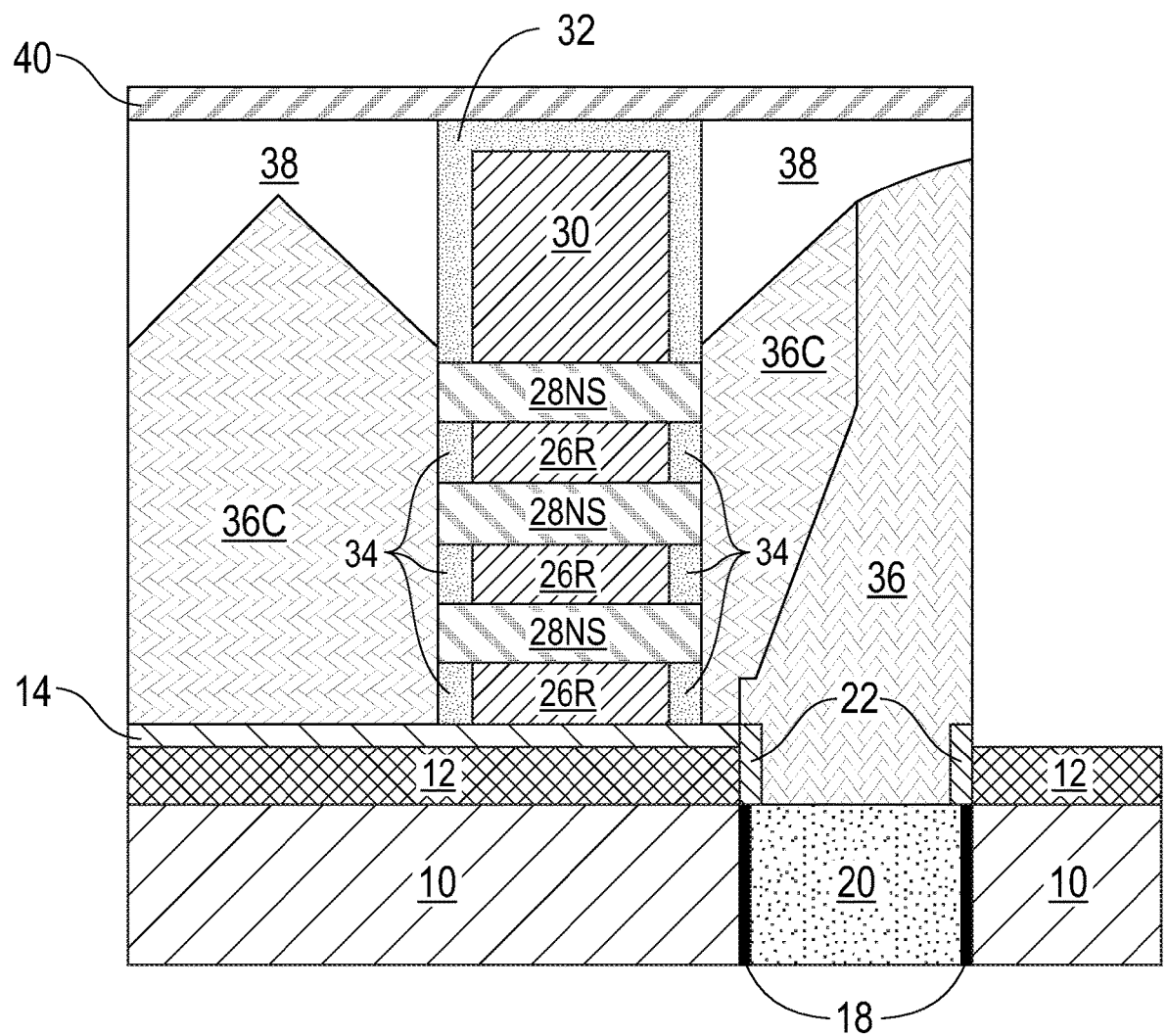
FIG. 12A is a cross sectional view of the exemplary semiconductor structure of FIGS. 11A-11B after removing the doped polycrystalline semiconductor material not protected by the eDRAM cut mask, and the underlying topmost semiconductor layer of the SOI substrate.
Figure 12B:
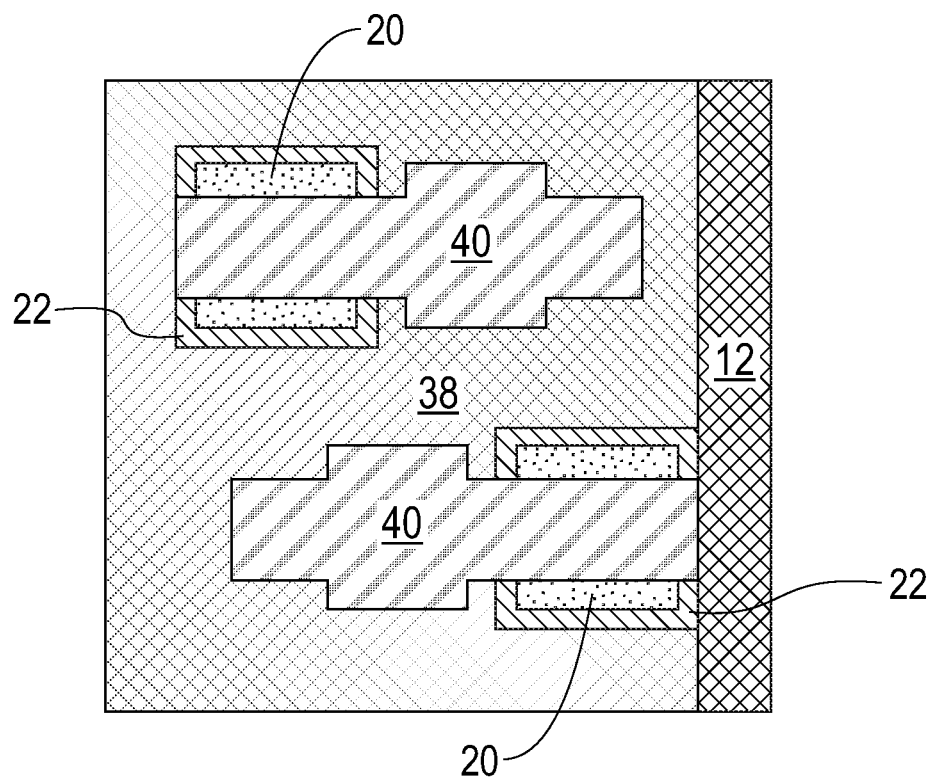
FIG. 12B is a top-down view of the exemplary semiconductor structure of FIG. 12A; in the drawing the ILD material is shown as a transparent layer.

Referring now to FIGS. 12A-12B, there are illustrated the exemplary semiconductor structure of FIGS. 11A-11B after removing the doped polycrystalline semiconductor material 36P not protected by the eDRAM cut mask 40, and the underlying topmost semiconductor layer 14 of the SOI substrate. The removal of the doped polycrystalline semiconductor material 36P not protected by the eDRAM cut mask 40 and the underlying topmost semiconductor layer 14 of the SOI substrate may be performed utilizing an etching process that is selective in removing the doped polycrystalline semiconductor material 36P and the underlying topmost semiconductor layer 14 of the SOI substrate. In one example, and when the doped polycrystalline semiconductor material 36P and the topmost semiconductor layer 14 are composed of silicon, potassium hydroxide may be used to remove the doped polycrystalline semiconductor material 36P not protected by the eDRAM cut mask 40, and the underlying topmost semiconductor layer 14 of the SOI substrate. The removal of the topmost semiconductor layer 14 exposes a topmost surface of insulator layer 12.

Figure 13A:
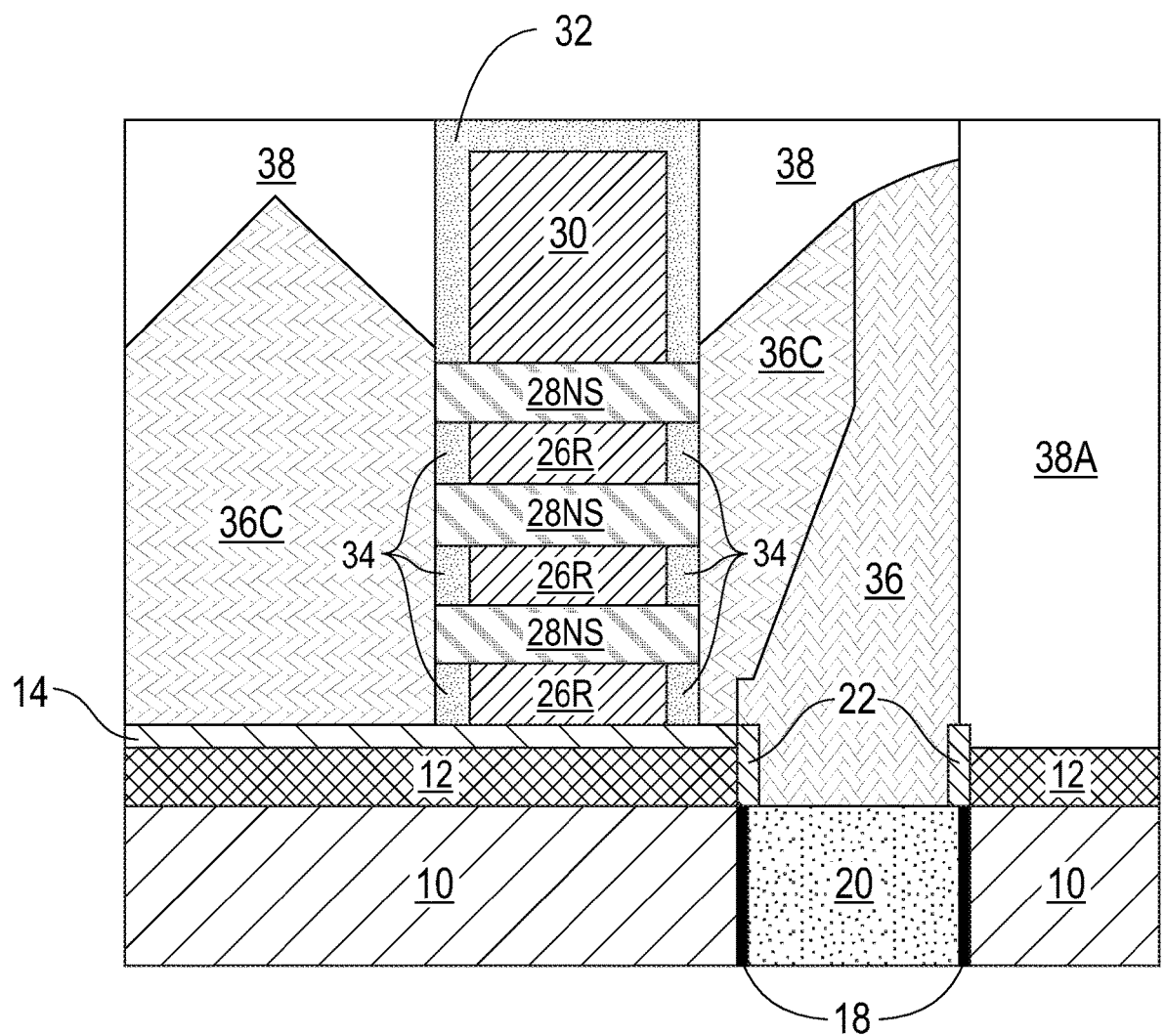
FIG. 13A is a cross sectional view of the exemplary semiconductor structure of FIGS. 12A-12B after removing the eDRAM cut mask, and forming additional ILD material.
Figure 13B:
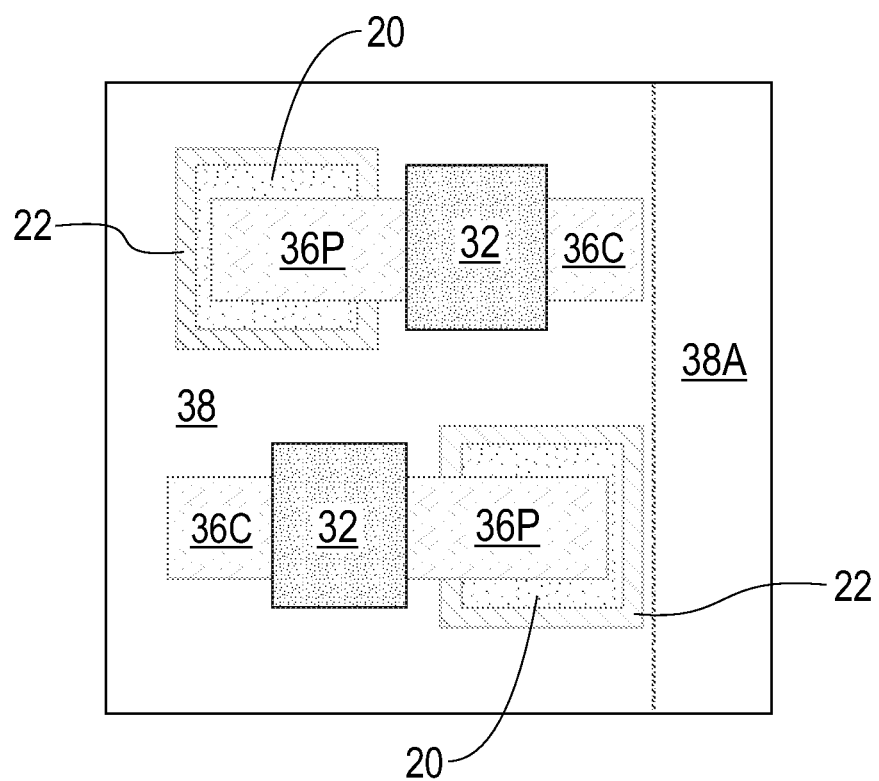
FIG. 13B is a top-down view of the exemplary semiconductor structure of FIG. 13A; in the drawing the ILD material is shown as a transparent layer.

Referring now to FIGS. 13A-13B, there are illustrated is a cross sectional view of the exemplary semiconductor structure of FIGS. 12A-12B after removing the eDRAM cut mask 40, and forming additional ILD material 38A. The removal of the eDRAM cut mask 40 may be performed utilizing any conventional material removal process. The additional ILD material 38A may be composed one of the dielectric materials mentioned above for ILD material 38. The additional ILD material 38A is typically, but not always, composed of a same dielectric material as ILD material 38. The additional ILD material 38A may be formed utilizing one of the techniques mentioned above for forming ILD material 38.

Figure 14:
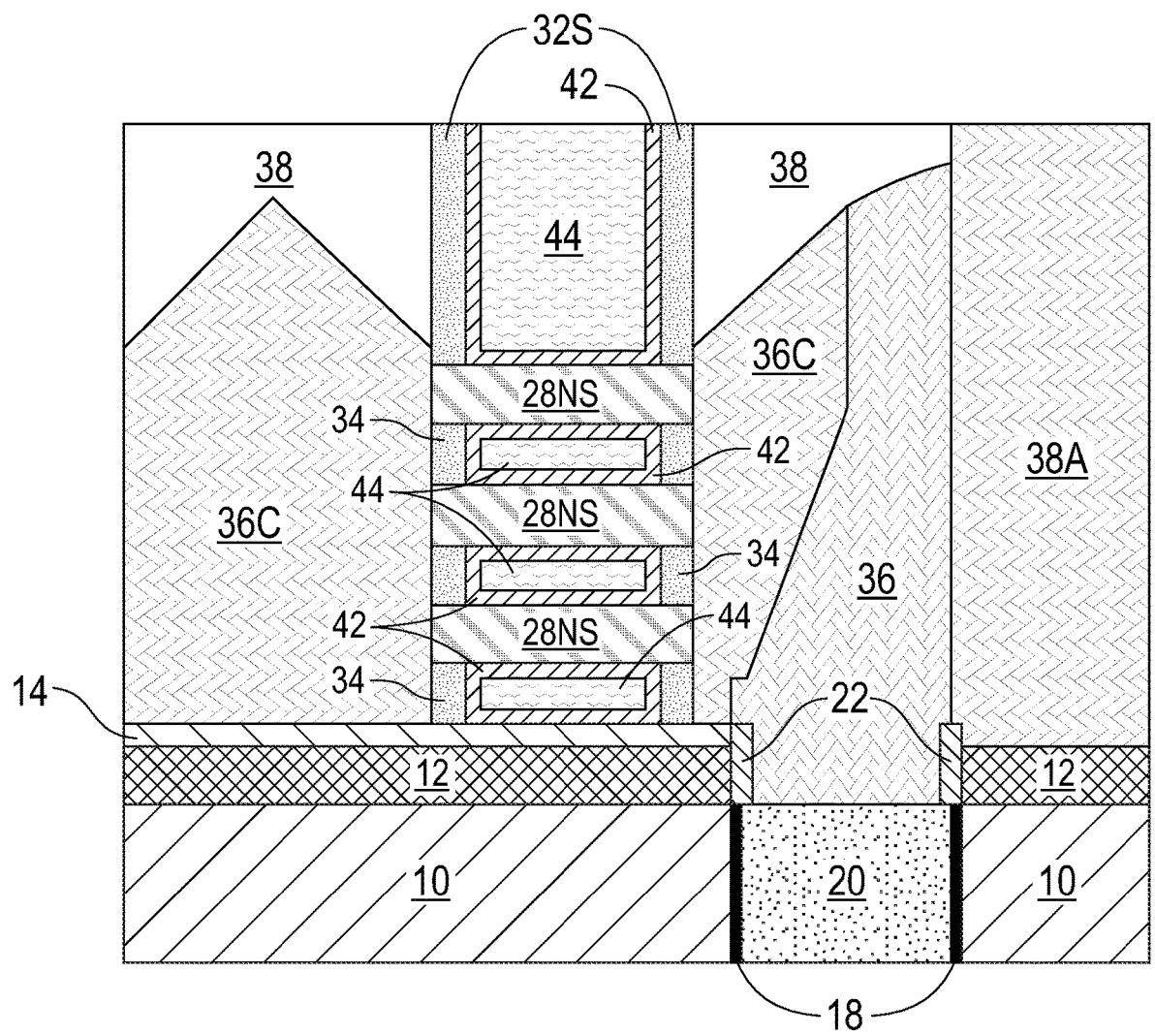
FIG. 14 is a cross sectional view of the exemplary semiconductor structure of FIGS. 13A-13B after removing the sacrificial gate structure and each recessed sacrificial semiconductor material nanosheet, and forming a functional gate structure wrapping around a physically exposed surface of each semiconductor channel material nanosheet.

Referring now to FIG. 14, there is illustrated the exemplary semiconductor structure of FIGS. 13A-13B after removing the sacrificial gate structure 30 and each recessed sacrificial semiconductor material nanosheet 26R, and forming a functional gate structure (42, 44) wrapping around a physically exposed surface of each semiconductor channel material nanosheet 28NS.

The sacrificial gate structure 30 can be removed utilizing one or more etching steps. In some embodiments, the etching step that is used in removing the sacrificial gate structure 30 may also remove the dielectric spacer material layer 32 that is located atop the sacrificial gate structure 30 forming dielectric spacers 32S. In other embodiments, the dielectric spacers 32S are formed, prior to removing the sacrificial gate structure 30 utilizing any conventional removal process including, for example, planarization. The removal process may also removed an upper portion of the ILD material 38 and the additional ILD material 38A. The removal of the sacrificial gate structure 30 provides an upper gate cavity that is located between the dielectric spacers 32S. Each recessed sacrificial semiconductor material nanosheet 26R is then removed utilizing an etching process so as to suspend each of the semiconductor channel material nanosheets 28NS within a given nanosheet stack.

A functional gate structure (42, 44) is then formed surrounding physically exposed surfaces of each semiconductor channel material nanosheet 28NS and within the upper gate cavity. By "functional gate structure" it is meant a permanent gate structure used to control output current (i.e., flow of carriers in the channel) of a semiconducting device through electrical or magnetic fields. The functional gate structure (42, 44) may include a gate dielectric material 42 and a gate conductor material 44. The gate dielectric material 42 may include a dielectric oxide, a dielectric nitride, and/or a dielectric oxynitride. In one example, the gate dielectric material 42 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material 42.

The gate dielectric material 42 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 42 can have a thickness in a range from 1 nm to 10 nm. Other thicknesses that are lesser than, or greater than, the aforementioned thickness range can also be employed for the gate dielectric material 42.

The gate conductor material 44 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor material 44 may comprise an nFET gate metal. In another embodiment, the gate conductor material 44 may comprise a pFET gate metal.

The gate conductor material 44 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material 44 can have a thickness from 50 nm to 200 nm. Other thicknesses that are lesser than, or greater than, the aforementioned thickness range can also be employed for the gate conductor material 44.

The functional gate structure can be formed by providing a gate material stack of the gate dielectric material 42, and the gate conductor material 44. A planarization process may follow the formation of the functional gate material stack.

FIG. 14 shows an exemplary semiconductor structure of the present application. The structure includes a nanosheet device comprising a plurality of stacked and suspended semiconductor channel material nanosheets 28NS located above a topmost semiconductor layer 14 of a semiconductor-on-insulator (SOI) substrate (Oct. 12, 2014). A functional gate structure (42, 44) surrounds a portion of each semiconductor channel material nanosheet 28NS of the plurality of stacked and suspended semiconductor channel material nanosheets, and a source/drain (S/D) region 36C composed of a doped single crystalline semiconductor material is located on each side of the functional gate structure (42, 44) and physically contacts sidewalls of each semiconductor channel material nanosheet 28NS of the plurality of stacked and suspended semiconductor channel material nanosheets. An embedded dynamic access memory (eDRAM) cell is laterally adjacent to the nanosheet device and is located in a trench that is present in the SOI substrate (Oct. 12, 2014). A strap 36 composed of a doped polycrystalline semiconductor material connects a polycrystalline semiconductor material electrode 20 of the eDRAM cell to one of the S/D regions of the nanosheet device.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a nanosheet device comprising a plurality of stacked and suspended semiconductor channel material nanosheets located above a topmost semiconductor layer of a semiconductor-on-insulator (SOI) substrate, a functional gate structure surrounding a portion of each semiconductor channel material nanosheet of the plurality of stacked and suspended semiconductor channel material nanosheets, and a source/drain (S/D) region composed of a doped single crystalline semiconductor material located on each side of the functional gate structure and physically contacting sidewalls of each semiconductor channel material nanosheet of the plurality of stacked and suspended semiconductor channel material nanosheets;
an embedded dynamic access memory (eDRAM) cell located laterally adjacent to the nanosheet device and located in a trench that is present in the SOI substrate;
a strap composed of a doped polycrystalline semiconductor material connecting a polycrystalline semiconductor material electrode of the eDRAM cell to one of the S/D regions of the nanosheet device; and
a collar dielectric material located entirely above a topmost surface of the polycrystalline semiconductor material electrode and on sidewalls of an upper portion of the trench, wherein the strap directly contacts a topmost surface of the collar dielectric material, a topmost surface of the polycrystalline semiconductor material electrode, an entirety of a sidewall of the collar dielectric material, and an entirety of a sidewall of the one of the S/D regions that the strap is connected to.

2. The semiconductor structure of claim 1, further comprising an inner spacer located between each semiconductor channel material nanosheet and contacting a sidewall of the functional gate structure.

3. The semiconductor structure of claim 2, further comprising a gate spacer located atop the topmost semiconductor channel material nanosheet and contacting a sidewall of an upper portion of the functional gate structure.

4. The semiconductor structure of claim 1, wherein the doped single crystalline semiconductor material and the doped polycrystalline semiconductor material are composed of n-doped silicon, and the polycrystalline semiconductor material electrode is also composed of n-doped silicon.

5. The semiconductor structure of claim 1, wherein the SOI substrate further includes a semiconductor material layer located beneath the topmost semiconductor layer, wherein an insulator layer separates the topmost semiconductor layer form the semiconductor material layer, and wherein the trench extends entirely through the topmost semiconductor layer and the insulating layer and partially into an upper portion of the semiconductor material layer that contains a n-type dopant.

6. The semiconductor structure of claim 1, further comprising an interlevel dielectric (ILD) material located above each S/D region and the strap.

7. The semiconductor structure of claim 6, wherein a portion of the ILD material is in direct physical contact with an insulator layer of the SOI substrate on a side of the trench opposite a side of the trench including the nanosheet device.

8. The semiconductor structure of claim 1, wherein the sidewalls of each semiconductor channel material nanosheet of the plurality of stacked and suspended semiconductor channel material nanosheets are vertically aligned to each other.

9. The semiconductor structure of claim 1, further comprising a node dielectric layer located beneath the polycrystalline semiconductor material electrode of the eDRAM cell.

10. The semiconductor structure of claim 1, wherein the strap has a height that is greater than a height of the one of the S/D regions that the strap is connected to.

* * * * *